United States Patent [19]

Kiyota

[11] Patent Number: 5,402,009
[45] Date of Patent: Mar. 28, 1995

[54] PULSE GENERATOR FOR GENERATING A VARIABLE-WIDTH PULSE HAVING A SMALL DELAY

[75] Inventor: Shinichi Kiyota, Kanagawa, Japan

[73] Assignee: Kabushiki Kaisha Toshiba, Kawasaki, Japan

[21] Appl. No.: 86,097

[22] Filed: Jul. 6, 1993

[30] Foreign Application Priority Data

Jul. 6, 1992 [JP] Japan .................................. 4-178576

[51] Int. Cl.⁶ .............................................. H03K 5/04
[52] U.S. Cl. ..................................... 327/176; 377/56; 327/31; 327/172
[58] Field of Search ...................... 328/61, 58; 377/55, 377/56, 114, 52, 47; 307/265, 234

[56] References Cited

U.S. PATENT DOCUMENTS

| | | | |
|---|---|---|---|
| 4,002,926 | 1/1977 | Moyer | 377/47 |
| 4,275,354 | 6/1981 | Suematsu et al. | 328/61 |
| 4,675,546 | 6/1987 | Shaw | 328/61 |
| 4,935,944 | 6/1990 | Everett | 377/56 |
| 5,022,059 | 6/1991 | Arai | 377/52 |

*Primary Examiner*—John S. Heyman
*Attorney, Agent, or Firm*—Foley & Lardner

[57] ABSTRACT

A pulse generator has a presetting clock synchronous counter having a count enable terminal, the counter which counts up input data using a clock signal whose basic unit of time width corresponds to its one period. The output from said counter is decoded to produce a first state signal. A second state signal is produced from said clock signal and a count enable signal for said counter. An output pulse having a desired pulse width is obtained by calculating the logical product of said first and second state signals.

5 Claims, 5 Drawing Sheets

PULSE GENERATOR FOR GENERATING A VARIABLE-WIDTH PULSE HAVING A SMALL DELAY

BACKGROUND OF THE INVENTION

1. Field of the Invention

This invention relates to a pulse generator for producing a pulse whose width can be set arbitrarily corresponding to given data. In particular, this invention relates to a pulse generator which can be used in a PWM (Pulse Width Modulation) system, and which is able to deal with a reference clock signal having a high frequency.

2. Description of the Prior Arts

FIG. 5 is a schematic diagram showing one prior art pulse generator of this invention. The pulse generator produces a pulse whose pulse width can be set arbitrarily corresponding to given data. FIG. 6 is a timing chart for explaining the operation of the circuit shown in FIG. 5. In this timing chart, N, which shows the bit number of input data as shown in FIG. 5, is set to 4, that is, N=4.

As shown in FIG. 5, the conventional pulse generator is comprised of the following: a presetting clock synchronous up-counter (referred to as a counter, below) 101 having a count-enable terminal; equality comparators 102 and 103, each of which compares binary data A (input A) of N bits with data B (input B) of N bits, and generates a level H signal from its output EQ when A=B; OR gates 104 and 105; an AND gate 106; and a T-type flip flop 107. The bit number of counter 101 can be set arbitrarily. In this case, a 4 bit counter is chose as an example. In other words, clock signal CLK 1 is input to this pulse generator in order to activate 4 bit up-counter 101. The basic unit of time width of this clock signal CLK 1 is equal to its one period.

In the case where the pulse having a pulse width of 4 $\mu$ s is required in said device, $4_{16}$ should be given as input data D and a clock signal having a 1 MHz frequency (its one period is equal to $1\mu s$) is given as clock signal CLK 1. The subscripts 16 mean that the number 4 is a hexadecimal digit.

In the circuit shown in FIG. 5, enable terminal EN in counter 101 is set to an assert state to allow counter 101 to count up. When equality comparator 102 finds that output CO of counter 101 reaches 0 (that means the beginning of counting up), it sets output EQ 1 to level H. Similarly, when equality comparator 103 finds that output CO of counter 101 reaches the same number as that of input data D, that is 4 in this case, it sets output EQ 2 to level H. Thereafter, OR gate 105 calculates the logical sum of signals EQ 1 and EQ 2 so as to produce clock signal CLK 2. A pulse P having a $4\mu s$ pulse width is obtained from this clock signal CLK 2 through T-type flip flop 107.

OR gate 104 is provided in order to fix clock signal CLK 2 to level L when input data D is equal to $0_{16}$, thus interrupting the output of pulse P. This is because that no pulse should be output from T-type flip flop 107, when data D is set to $0_{16}$ (pulse width=0).

In the above mentioned pulse generator, the following problems arise.

(1) Requires a large scale circuit

The circuit scale of this device becomes larger in proportion to bit number N of input data D. In other words, when N becomes larger, larger scales of counter 101, equality comparators 102 and 103, and OR gate 104 should be used. As a result, the circuit becomes enormous in scale.

(2) Pulse width $t_{pw2}$ of output pulse P being affected significantly by the time delay caused by gates.

In the timing chart shown in FIG. 6, pulse width $t_{pw2}$ of output pulse P is determined based on to the transition points of output CO from counter 101. In actuality, the rising edge of pulse P contains three kinds of time delays $t_{D1}$, $t_{D3}$, and $t_{D7}$ which occur from the time that counter output CO changes to $0_{16}$. Also, the falling edge of pulse P contains three kinds of time delay $t_{D2}$, $t_{D5}$, and $t_{D8}$ which occur from the time that counter output CO changes to $4_{16}$. Thus, the rising edge and the falling edge of output pulse P are influenced respectively by three parameters. Among these, $t_{D1}$ and $t_{D2}$ caused by comparators 102 and 103 have quite large values as compared with the other parameters caused by gates, because equality comparators usually have a large delay time.

In addition, clock signal CLK 2, which is to be input to T-type flip flop 107, is obtained by calculating the logical product of clock signal CLK 1 and the output from comparator 102 or 103 using AND gate 106. As a result, if the sum of $t_{D1}$ and $t_{D3}$ becomes larger than the pulse width $t_{pw1}$ of clock signal CLK 1, pulse H given by clock signal CLK 2 can't be output any more. For parameters $t_{D2}$ and $t_{D5}$, the same situation occurs. Accordingly, in order to operate this pulse generator adequately, the maximum operating frequency should satisfy the following conditions:

$t_{pw1} > t_{D1} + t_{D3}$, and $t_{pw1} > t_{D2} + t_{D5}$.

As a result, the reference frequency of clock signal CLK 1 should be chosen within a few MHz.

SUMMARY OF THE INVENTION

This invention has been made to overcome the above mentioned problems of the prior art pulse generator.

Therefore, one objective of the present invention is to provide a pulse generator in which the circuit structure is simplified to reduce the required number of gates.

Another objective of the present invention is to provide a pulse generator in which the influence of time delay caused by gates is reducible in order to deal with a clock signal having a high reference frequency.

The first feature of the present invention is to provide a pulse generator which is comprised of the following as shown in FIG. 1: a presetting clock synchronous counter 1 which has an input terminal E for a count enable signal (EN) and counts up input data D using a clock signal CLK 1 whose basic unit of time width corresponds to its one period; first logical means 2 for decoding output CO from said counter 1 in order to produce a first state signal B; and second logical means 3 for producing a second state signal C according to said count enable signal EN and said clock signal CLK 1.

The second feature of the present invention is to provide the pulse generator having said first feature, further comprising an AND gate 4 for calculating the logical product of said state signal B from said first logical means 2 and said state signal C from said second logical means 3 so as to obtain pulse signal P.

According to said first and second features of the present invention, presetting clock synchronous counter 1 counts up input data D using clock signal CLK 1 whose basic unit of time width corresponds to its one pulse period. Then, first logical means 2 decodes output CO from counter 1 to obtain the first state signal B. On the other hand, second logical means 3 generates the second state signal C according to count enable signal EN and clock signal CLK 1. Thereafter, using gate 4, the logical product of state signals B and C are calculated so as to generate output pulse P.

For example, if a down-counter is used as counter 1, the rising edge of said pulse P is obtained based on the rising edge of the first clock signal CLK 1 which arises once counter 1 has been enabled. On the other hand, the falling edge of output pulse P is obtained based on a transition point of output CO from counter 1. The width of pulse P is decided based on the rising and falling edges thus obtained. The pulse generator of this invention, therefore, requires no equality comparator so as to obtain output pulse P having an arbitrarily set pulse width. According to this fact, this invention can reduce the required number of gates, and so, the magnitude of time delay affecting on the rising and falling edges of pulse P is reducible. As a result, this invention can realize a pulse generator whose maximum operating frequency can be set equal to the maximum operating frequency of presetting clock synchronous counter 1.

These and other objectives, features and advantages of the present invention will be more apparent from the following detailed description of preferred embodiments in conjunction with the accompanying drawings.

DETAILED DESCRIPTION OF PREFERRED EMBODIMENTS

Figure 1:
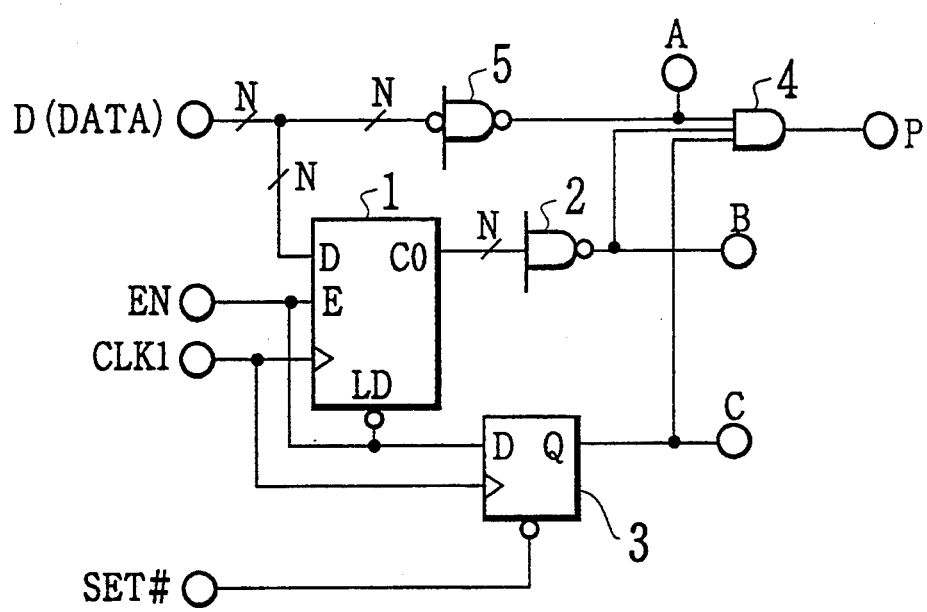
FIG. 1 is a schematic diagram showing the structure of a pulse generator according to the first embodiment of the present invention.
Figure 2:
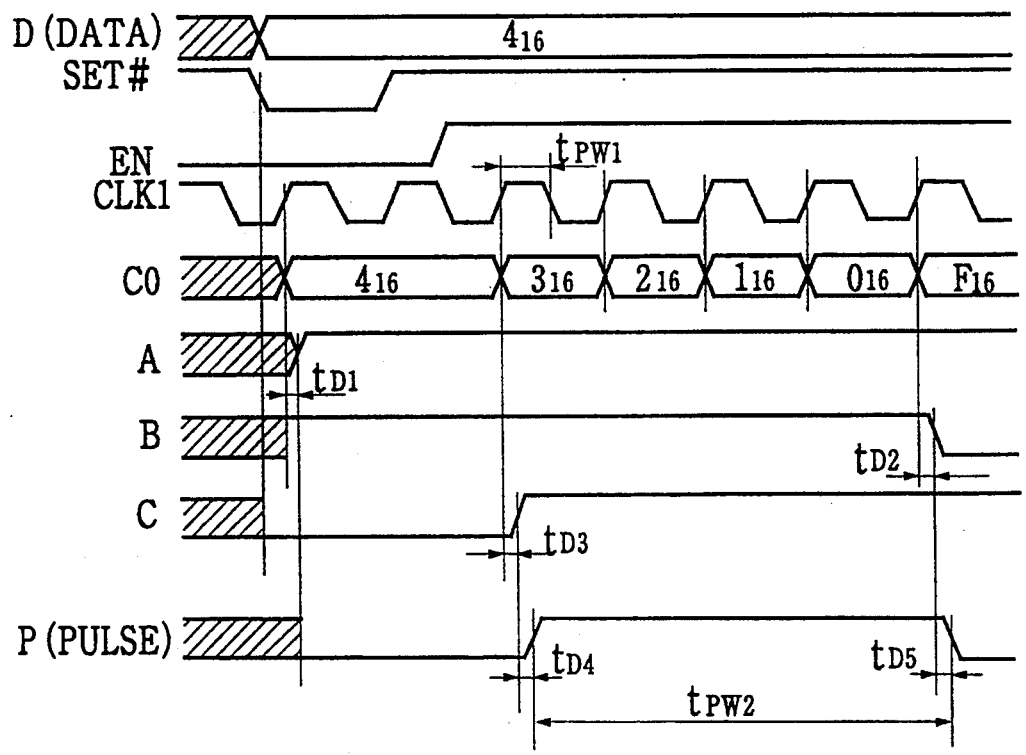
FIG. 2 is a timing chart for explaining the operation of the pulse generator according to said first embodiment, when N is set to 4.

The structure of a pulse generator is shown in FIG. 1 according to the first embodiment of the present invention. One example of the timing chart of this device is shown in FIG. 2 in order to explain the operation of this device. In FIG. 2, N is set to 4.

As shown in FIG. 1, the pulse generator of this embodiment is comprised of the following: a presetting clock synchronous down-counter 1 which has an input terminal E for a count enable signal EN and counts up input data D using a clock signal CLK 1 whose basic unit of time width corresponds to its one period; an OR gate 5 for generating a signal A which is set at level H when input data D is non-zero; a NAND gate 2 for decoding output CO from counter 1 to produce a first state signal B; a D-type flip flop 3 for producing a second state signal C according to count enable signal EN and clock signal CLK 1; and an AND gate 4 for calculating the logical product of signals A, B, and C.

The bit number of counter 1 can be chosen arbitrarily. In this case, a 4 bit counter is chosen in order to simplify the explanation of this device. In other words, the pulse generator of this embodiment drives 4 bit counter 1 by supplying its clock terminal with clock signal CLK 1 whose basic unit of time width corresponds to its one period.

If an output pulse having a $4\mu$ s pulse width is required, $4_{16}$ is given as input data D, and a clock signal having a 1 MHz frequency is supplied to counter 1.

In said situation, signal C is set to level H at the rising edge of the clock signal which arises first once said enable signal EN supplied to counter 1 is set to an assert state. This level H signal gives the rising edge of output pulse P. On the other hand, NAND gate 2 decodes output $CO=F_{16}$ from counter 1 to produce signal B of level L. This level L signal gives the falling edge of output pulse P. In addition, when input data D is equal to $0_{16}$, that means the pulse width of output pulse P is set to 0, output signal A from OR gate 5 becomes level L. As a result, by calculating the logical product of signals A, B, and C, output pulse P having a pulse width $t_{pw2}$ of 4 ns is obtained.

In the above case, as shown in FIG. 2, the time delay affecting on the rising edge of output pulse P is caused by $t_{D3}$, which is from flip flop 3, and $t_{D4}$, which is from AND gate 4. In the same manner, the time delay affecting on the falling edge of output pulse P is caused by $t_{D2}$, which is from NAND gate 2, and $t_{D5}$, which is from AND gate 4 once output CO from counter 1 has changed to $F_{16}$ ($CO=F_{16}$). The respective delay, therefore, includes only two parameters, thus reducing the magnitude of the time delay contained in output pulse P.

Figure 6:
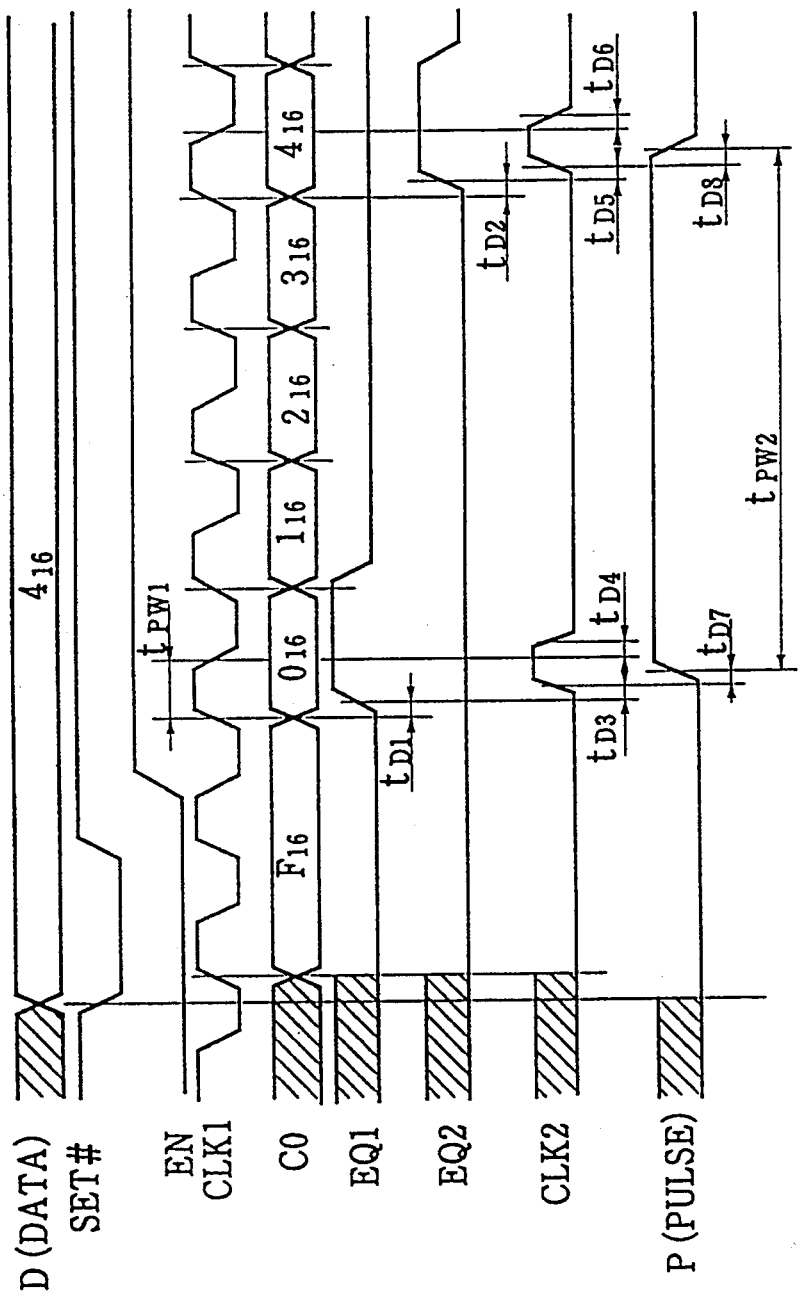
FIG. 6 is a timing chart for explaining the operation of the pulse generator depicted in FIG. 5, when N is set to 4.

In aforementioned prior art pulse generator, the rising edge and the falling edge of output pulse P are determined by one-shot pulses as shown in FIG. 6. On the contrary, this embodiment does not use one-shot pulses for determining the rising and falling edges of output pulse P. Accordingly, the pulse generator of this embodiment does not have the restriction caused by the relation between pulse width $t_{pw1}$ of clock signal CLK and the time delay, unlike the case of the prior art pulse generator. The pulse generator of this embodiment can, therefore, produce output pulse P as far as counter 1 and D-type flip flop 3 are operating. Accordingly, the maximum operating frequency of this pulse generator becomes to the same value as that of the maximum operating frequency of counter 1, which is considered to have the lowest operating frequency among the structure elements. According to this fact, a reference clock frequency of several 10 MHz can be selected as the operating frequency of this embodiment. In this case, the logical process of each structure element is considered to be the same for each other.

Next, the second embodiment of the present invention will be explained with referring to FIG. 3. This figure shows the structure of a driving circuit for thermal printing heads, the circuit which includes the pulse generator 11 of the first embodiment. FIG. 4 shows a timing chart for explaining the operation of the second embodiment. The driving circuit shown in FIG. 3 drives 48 resisters R1, R2 . . . R48, such as thermal printing heads, using the pulse generator of the first embodiment.

In the pulse generator according to the first embodiment, a plurality of pulses are successively produced as far as counter 1 is operating. In this second embodiment, the signal made from the logical product of state signal B and enable signal EN is input to enable terminal E of counter 1, so as to interrupt the operation of this circuit. In the circuit shown in FIG. 3, this logical product is obtained with AND gate 41. Thus, once a pulse has been output, the circuit stops its operation until reset signal SET# is set to an assert state (level L) again.

In other words, the pulse, which has a pulse width corresponding to the 4 bits of input data D, is obtained in the following conditions: inputting a 1 MHz clock signal as clock signal CLK 1 to the clock terminal of counter 1; inputting a pulse of level L to the terminal of reset signal SET#; and changing enable signal EN from level L to level H. For example, when input data D equals $1_{16}$, a pulse having a time width of 1 μs is obtained. As well, a pulse of 2 μs time width is obtained when $2_{16}$ is input as input data D, and a pulse of 10 μs is obtained when $A_{16}$ is input as input data D.

Figure 3:
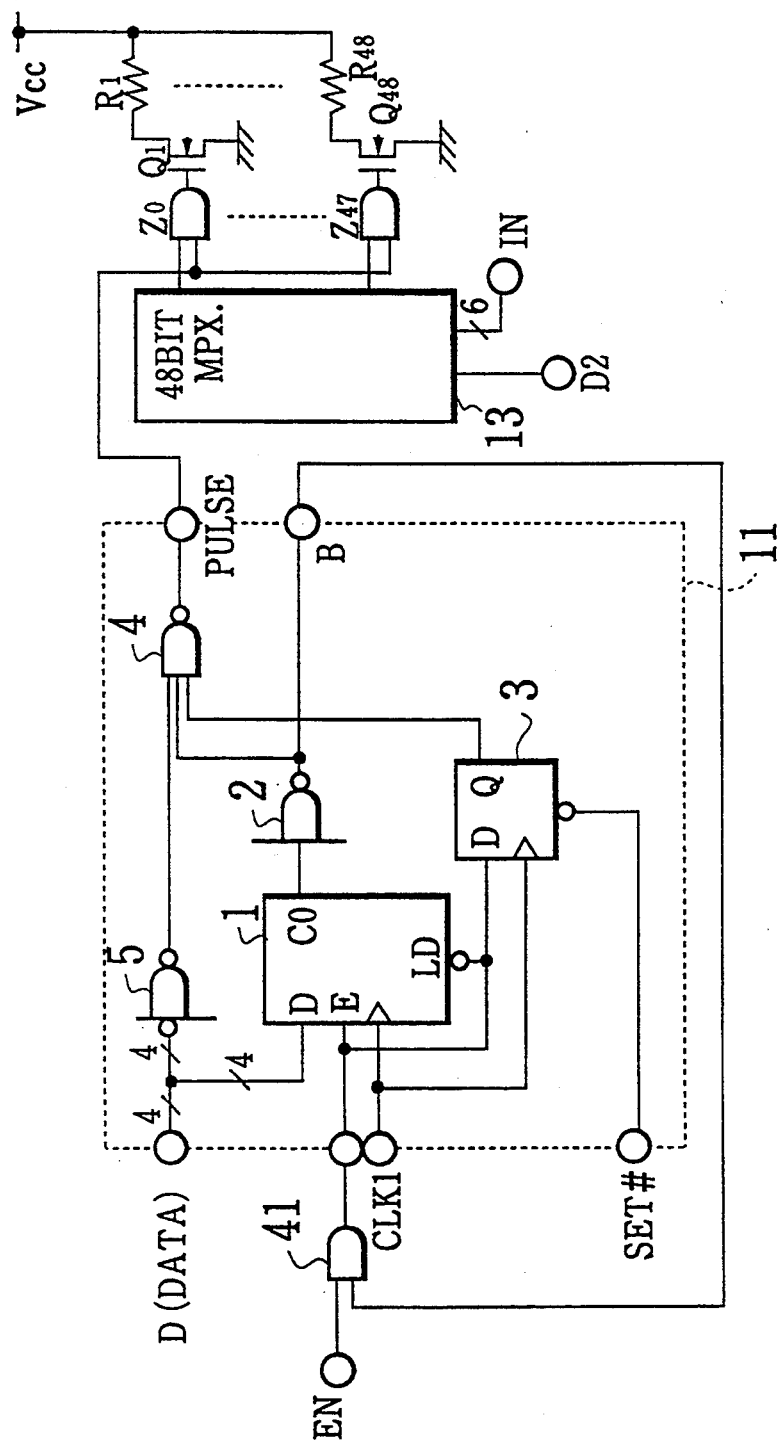
FIG. 3 is a schematic diagram showing the structure of a driving circuit for a thermal printer which includes the pulse generator according to the second embodiment of the present invention.
Figure 4:
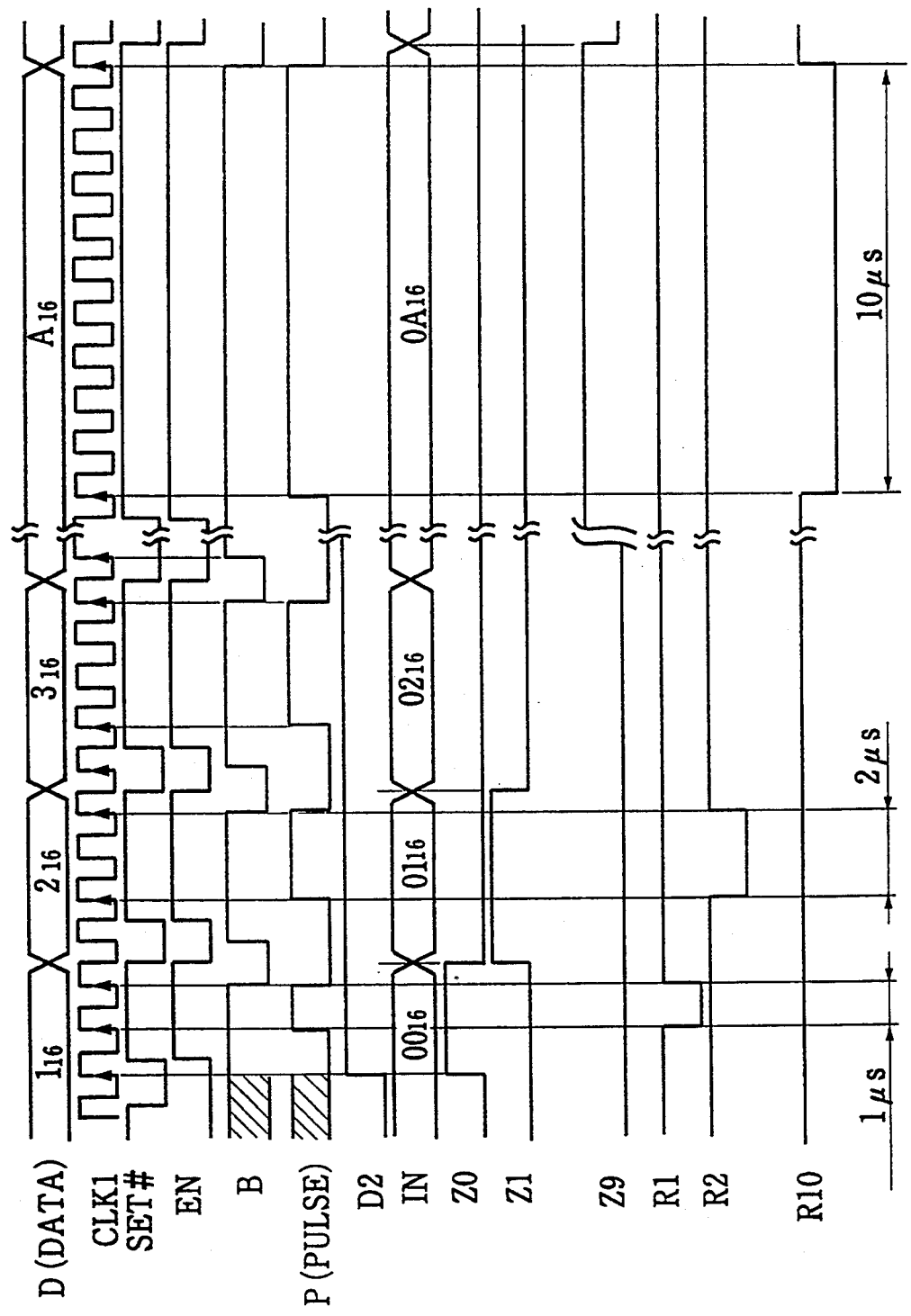
FIG. 4 is a timing chart for explaining the operation of the pulse generator according to said second embodiment.
Figure 5:
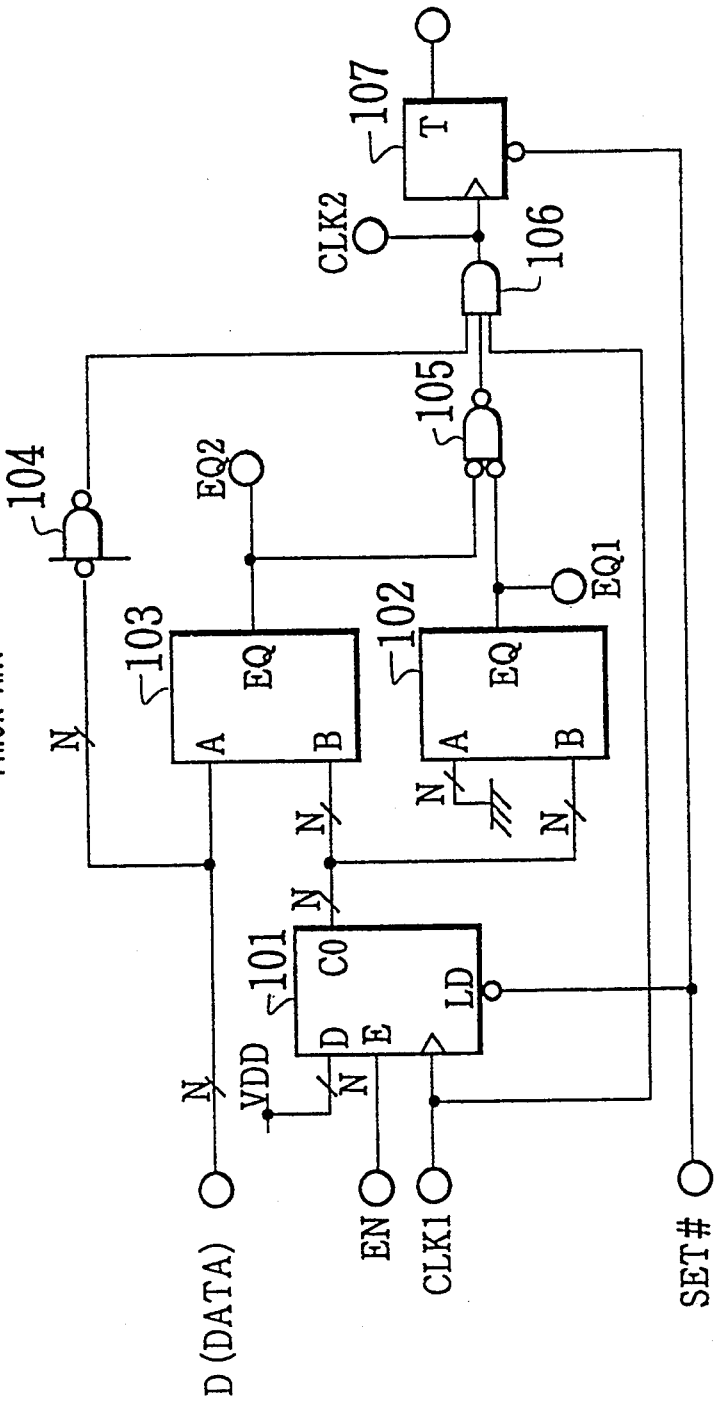
FIG. 5 is a schematic diagram showing the structure of a conventional pulse generator.

In the circuit shown in FIG. 3, the above mentioned output pulse are delivered to the driving circuit for thermal printing heads. This driving circuit is comprised of a multiplexer 13 of 48 bits, AND gates Z0, Z1 ... Z47, FETs Q1, Q2 ... Q48, and resisters R1, R2 ... R47. Into multiplexer 13, Data D2 and signal IN, which is a 6 bit selecting signal, are input. Also, said resisters R1, R2 ... R48 correspond to each one of 48 bit thermal printing heads. Thus, when data D2 are given to certain AND gates and output pulse P is given to AND gates Z0, Z1 ... Z47 as an enable signal, certain FETs can be driven to activate corresponding printing heads.

In the lower part of FIG. 4, example wave forms of the voltages across resisters R1, R2 ... and R48 are shown. As is evident from these wave forms, FET Q1, FET Q2 ... and FET Q48 are activated in turn. Also, each pulse width of the driving pulses for resisters R1, R2 ... R48 is determined according to the pulse width of input data D. In addition, the bit to be activated is determined according to the value given to selecting signal IN of multiplexer 13.

Although the above embodiment has a 48 bit structure, the bit number of the circuit can be set arbitrarily. So, this embodiment is applicable to the driving circuit which drives resisters having arbitrarily set bits with pulses having arbitrarily set time width. In this case, however, multiplexer 13 output signals, which are input as data D2, only from the bit terminals selected by selecting signal IN. The other bit terminals should be kept at level L in this case.

In summary, according to the present invention, input data are counted by a presetting clock synchronous counter using a clock signal whose basic unit of time width corresponds to its one period. The output from this counter is then decoded by the first logical means, thus producing the first state signal. On the other hand, the second logical means produces the second state signal according to the count enable signal and said clock signal. Thereafter, said first and second state signals are input to a gate in order to obtain the logical product of these signals. A desired pulse output is thus obtained as the output from said gate. For example, if said counter is a down-counter, the time width of the output pulse is determined in the following way. The rising edge of the output pulse is determined according to the rising edge of a clock pulse which is obtained first once said counter has been set to an enable state. The falling edge of the output pulse is determined according to the transition point of the counter output. So, as compared with the prior art pulse generator, the pulse generator of this invention can reduce the required number of gates. From this fact, it is understood that the delay times contained in the output pulse can be shortened as compared with the prior art device. In addition, because the rising and falling edges of the output pulse are determined not by one shot pulses, but by the first and second state signals, this invention can provide a pulse generator in which the maximum reference clock frequency can be set to the same value as that of the maximum operating frequency of the presetting clock synchronous counter.

What is claimed is:

1. A pulse generator for generating a variable width pulse, comprising:
    a first terminal connected to receive clock signals;
    a second terminal connected to receive a data signal indicating a number of clock signals corresponding to a desired pulse width;
    a third terminal connected to receive an enable signal;
    a down counter having a data terminal connected to said second terminal, an enable terminal connected to said third terminal and a clock terminal connected to said first terminal, said down counter counting down the number of clock signals indicated by said data signal, when said enable signal is received, in synchronism with said clock signals and generating output signals indicating a counted number;
    a flop-flop, having an enable terminal connected to said third terminal and a clock terminal connected to said first terminal, said flip-flop outputting a first state signal which indicates an initiation of the counting down by said down counter, said first state signal being used to generate a start of said variable width pulse; and
    a detection circuit connected to a receive said output signals from said down counter, said detection circuit detecting when said output signals indicate that the counted number is a particular number and producing a second state signal indicating an end of said variable width pulse.

2. A pulse generator as recited in claim 1, wherein said particular number is zero.

3. A pulse generator as recited in claim 1, further comprising a pulse generating circuit connected to receive said first state signal and said second state signal, said pulse generating circuit starting said variable width pulse upon receipt of said first state signal and ending said variable width pulse upon receipt of said second state signal.

4. A pulse generator as recited in claim 3, wherein:
    said flip-flop circuit comprises a D-type flip-flop;
    said detection circuit comprises a NAND gate; and
    said pulse generating circuit comprises an AND gate.

5. A pulse generator as recited in claim 1, further comprising an enable circuit, wherein said enable circuit has a first input for receiving said enable signal and a second input for receiving said second state signal, an output of said enable circuit being supplied to said third terminal, said enable circuit preventing said enable signal from being supplied to said third terminal when said second state signal is received.

* * * * *